United States Patent
Iwase

(10) Patent No.: US 7,145,813 B2
(45) Date of Patent: Dec. 5, 2006

(54) SEMICONDUCTOR DEVICE WITH CIRCUIT FOR DETECTING ABNORMAL WAVEFORM OF SIGNAL AND PREVENTING THE SIGNAL FROM BEING TRANSMITTED

(75) Inventor: Taira Iwase, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/034,842

(22) Filed: Jan. 14, 2005

(65) Prior Publication Data

US 2005/0157566 A1    Jul. 21, 2005

(30) Foreign Application Priority Data

Jan. 15, 2004   (JP) ............................ 2004-008304

(51) Int. Cl.
*G11C 7/00* (2006.01)
(52) U.S. Cl. .................................. 365/191; 365/189.09
(58) Field of Classification Search ................ 365/191, 365/189.09
See application file for complete search history.

(56) References Cited

U.S. PATENT DOCUMENTS

| 4,761,572 A | * | 8/1988 | Tanizawa | .................... 327/310 |
| 4,817,077 A | * | 3/1989 | Ono | ........................ 369/53.15 |
| 6,294,939 B1 | | 9/2001 | McClure | |
| 6,847,257 B1 | * | 1/2005 | Edwards et al. | .............. 330/10 |
| 6,892,588 B1 | * | 5/2005 | Nagase et al. | ......... 73/862.326 |
| 7,002,358 B1 | * | 2/2006 | Wyatt | ........................ 324/622 |

FOREIGN PATENT DOCUMENTS

JP       2003-295988        10/2003

* cited by examiner

*Primary Examiner*—M. Tran
(74) *Attorney, Agent, or Firm*—Oblon, Spivak, McClelland, Maier & Neustadt, P.C.

(57) ABSTRACT

A semiconductor device includes a first detection circuit, a second detection circuit, a determination circuit and a pulse generation circuit. The first detection circuit detects the leading edge of the pulse waveform of an input signal. The second detection circuit detects the trailing edge of the pulse waveform of the input signal. The determination circuit determines whether the pulse width of the pulse waveform is shorter than a given period, based on detection results of the first detection circuit and the second detection circuit. The pulse generation circuit generates a pulse signal when the determination circuit determines that the pulse width of the pulse waveform is shorter than the given period.

12 Claims, 4 Drawing Sheets

SEMICONDUCTOR DEVICE WITH CIRCUIT FOR DETECTING ABNORMAL WAVEFORM OF SIGNAL AND PREVENTING THE SIGNAL FROM BEING TRANSMITTED

CROSS-REFERENCE TO RELATED APPLICATIONS

This application is based upon and claims the benefit of priority from prior Japanese Patent Application No. 2004-008304, filed Jan. 15, 2004, the entire contents of which are incorporated herein by reference.

BACKGROUND OF THE INVENTION

1. Field of the Invention

The present invention relates to a semiconductor device and, more specifically, to a semiconductor device with a circuit for detecting an abnormal waveform of an input signal and preventing the signal from being transmitted.

2. Description of the Related Art

Conventionally, a semiconductor device, especially a semiconductor memory has been often supplied with a signal having an abnormal waveform whose pulse width is shorter than a fixed period due to noise on a mounting substrate, the skew of an address signal output from a CPU, etc. In general, the semiconductor memory is often supplied with a signal whose pulse width is 5 ns or less.

If a semiconductor memory receives a signal having an abnormal waveform, it responds to the abnormal waveform to cause the system to malfunction. In order to resolve this problem, the following method has been adopted. A noise filter is provided on an input signal path to prevent a semiconductor memory from responding to an abnormal waveform (see, for example, Jpn. Pat. Appln. KOKAI Publication No. 2003-295988).

The above method however has the problem. If a semiconductor memory is prevented from responding to an input signal whose pulse width is 5 ns or less, its response is delayed by 5 ns even when the memory is supplied with a normal waveform. In a system that requires a high-speed operation whose access time ranges from 30 ns to 50 ns, the operating margin becomes very narrow if the access time is 5 ns delay. Accordingly, a method with no penalty for access time is required.

BRIEF SUMMARY OF THE INVENTION

A semiconductor device according to an aspect of the present invention, comprises a first detection circuit which detects a leading edge of a pulse waveform of an input signal, a second detection circuit which detects a trailing edge of the pulse waveform of the input signal, a determination circuit which determines whether a pulse width of the pulse waveform is shorter than a given period, based on detection results of the first detection circuit and the second detection circuit, and a pulse generation circuit which generates a pulse signal when the determination circuit determines that the pulse width of the pulse waveform is shorter than the given period.

A semiconductor device according to another aspect of the present invention, comprises a first detection circuit which detects a leading edge of a pulse waveform of an input signal and outputs a first signal having a pulse width corresponding to a given period, a second detection circuit which detects a trailing edge of the pulse waveform of the input signal and outputs a second signal having a pulse width corresponding to the given period, a determination circuit which performs a logical operation in response to the first signal output from the first detection circuit and the second signal output from the second detection circuit and determines whether the pulse width of the pulse waveform is shorter than the given period, and a pulse generation circuit which generates a pulse signal when the determination circuit determines that the pulse width of the pulse waveform is shorter than the given period.

DETAILED DESCRIPTION OF THE INVENTION

Figure 1:
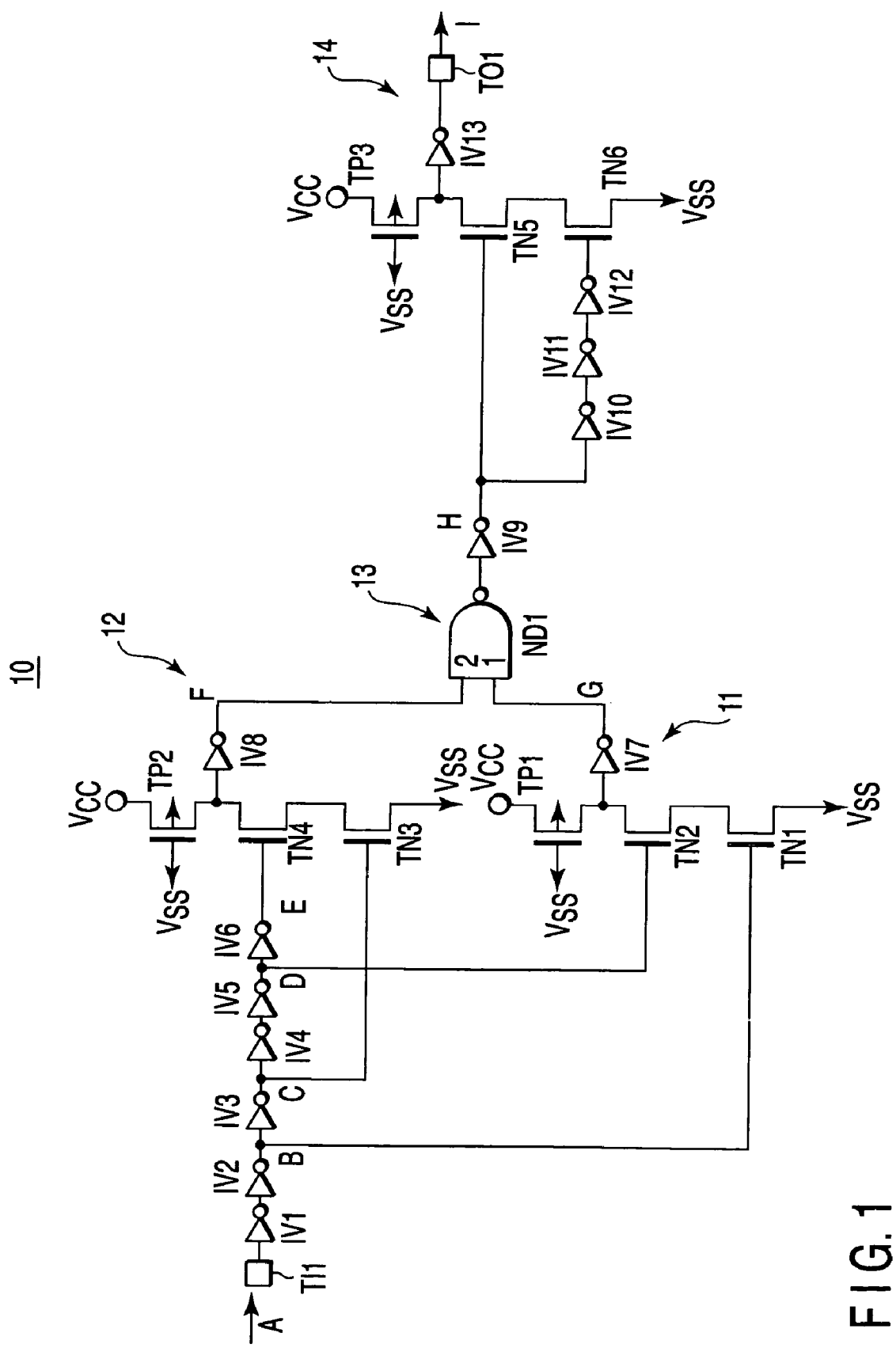
FIG. 1 is a circuit diagram of a pulse waveform detection circuit according to a first embodiment of the present invention.

A semiconductor device according to each of the embodiments of the present invention will be described with reference to the accompanying drawings. The same components are indicated by the same reference numerals throughout the drawings.

First Embodiment

In the first embodiment, a pulse waveform detection circuit will be described first, and then a semiconductor memory that eliminates an abnormal waveform using the pulse waveform detection circuit. The pulse waveform detection circuit detects that the pulse width of an input waveform is shorter than a preset period and generates a pulse signal. A hold circuit (latch circuit) is provided in a stage precedent to an output buffer circuit of the semiconductor memory. Using the pulse waveform detection circuit, the hold circuit prevents an abnormal waveform whose pulse width is shorter than a given period from passing and allows a normal waveform whose pulse width is longer than the given period to pass. The abnormal waveform indicates an input noise signal whose pulse width is shorter than the given period, and the normal waveform indicates an input normal signal whose pulse width is not shorter than the given period.

FIG. 1 is a circuit diagram of a pulse waveform detection circuit 10 according to the first embodiment of the present invention. Six inverters IV1 to IV6 are connected in series to an input terminal TI1. The output terminal of the inverter IV2 is connected to the gate of an n-channel MOS transistor TN1, and the output terminal of the inverter IV5 is connected to the gate of an n-channel MOS transistor TN2. The drain of the n-channel MOS transistor TN1 is connected to the source of the n-channel MOS transistor TN2. The drain of the n-channel MOS transistor TN2 is connected to the first input terminal of a NAND circuit ND1 via the inverter IV7. The drain of the n-channel MOS transistor TN2 is also connected to the drain of a p-channel MOS transistor TP1. A power supply voltage Vcc is applied to the source of the p-channel MOS transistor TP1. A reference potential Vss is applied to the gate of the p-channel MOS transistor TP1 and the source of the n-channel MOS transistor TN1.

The output terminal of the inverter IV3 is connected to the gate of an n-channel MOS transistor TN3, and the output terminal of the inverter IV6 is connected to the gate of an n-channel MOS transistor TN4. The drain of the n-channel MOS transistor TN3 is connected to the source of the n-channel MOS transistor TN4. The drain of the n-channel MOS transistor TN4 is connected to the second input terminal of the NAND circuit ND1 via the inverter IV8. The drain of the n-channel MOS transistor TN4 is also connected to the drain of a p-channel MOS transistor TP2. A power supply voltage Vcc is applied to the source of the p-channel MOS transistor TP2. A reference potential Vss is applied to the gate of the p-channel MOS transistor TP2 and the source of the n-channel MOS transistor TN3.

The output terminal of the NAND circuit ND1 is connected to the gate of an n-channel MOS transistor TN5 via the inverter IV9. The output terminal of the inverter IV9 is connected to the gate of an n-channel MOS transistor TN6 via inverters IV10, IV11 and IV12 connected in series. The drain of the n-channel MOS transistor TN6 is connected to the source of the n-channel MOS transistor TN5. The drain of the n-channel MOS transistor TN5 is connected to an output terminal TO1 via an inverter IV13. The drain of the n-channel MOS transistor TN5 is also connected to the drain of a p-channel MOS transistor TP3. A power supply voltage Vcc is applied to the source of the p-channel MOS transistor TP3. A reference potential Vss is applied to the gate of the p-channel MOS transistor TP3 and the source of the n-channel MOS transistor TN6.

Assume here that the signal input to the input terminal TI1 is A, the signal output from the inverter IV2 is B, the signal output from the inverter IV3 is C, the signal output from the inverter IV5 is D and the signal output from the inverter IV6 is E. Assume also that the signal output from the inverter IV8 is F, the signal output from the inverter IV7 is G and the signal output from the output terminal TO1 is I.

An operation of the pulse waveform detection circuit 10 according to the first embodiment will be described.

Figure 2:
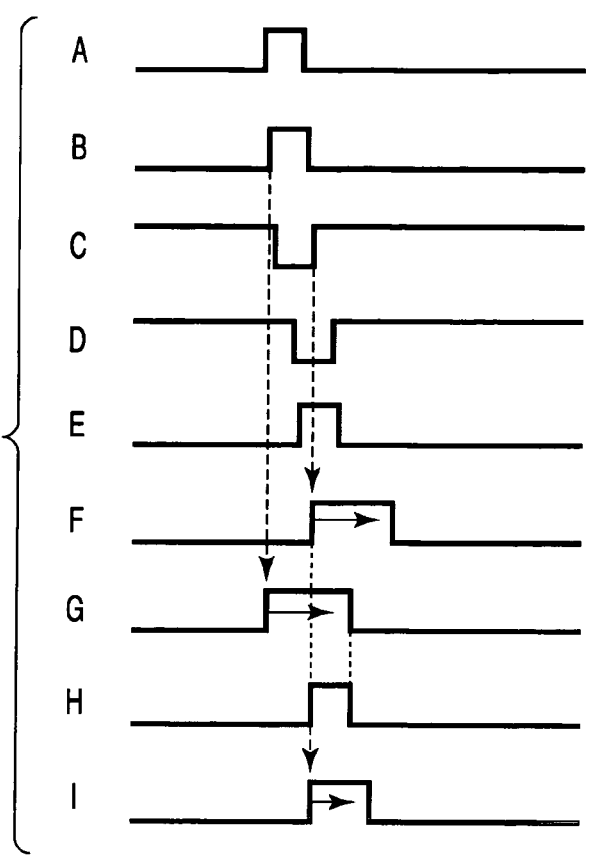
FIG. 2 is a timing chart showing an operation of the pulse waveform detection circuit according to the first embodiment of the present invention.
Figure 3:
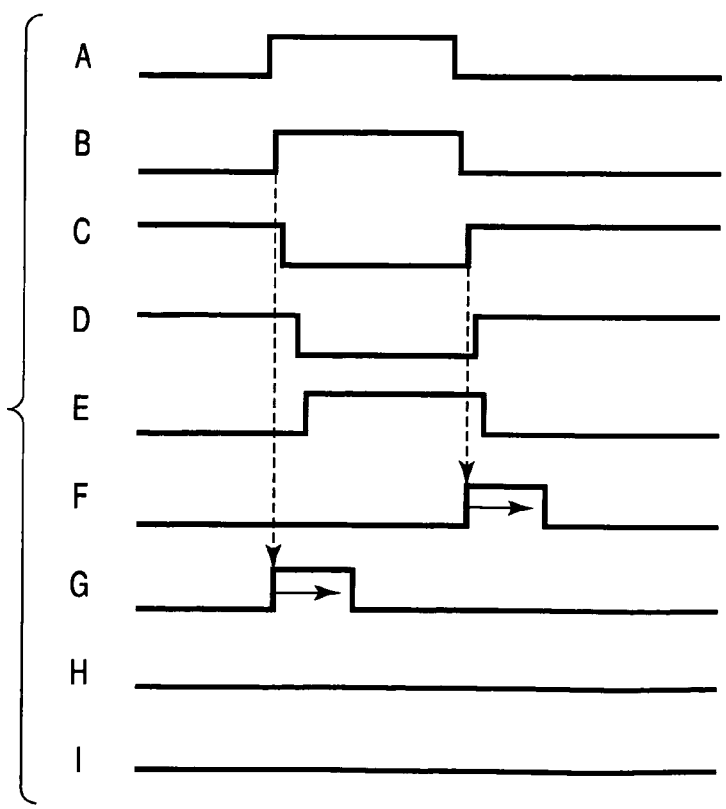
FIG. 3 is a timing chart showing another operation of the pulse waveform detection circuit according to the first embodiment of the present invention.

FIGS. 2 and 3 are timing charts each showing an operation of the pulse waveform detection circuit 10. FIG. 2 shows an operation of the circuit 10 to which an abnormal waveform is input as signal A, and FIG. 3 shows an operation of the circuit 10 to which a normal waveform is input.

The pulse waveform detection circuit 10 includes a rise detection circuit 11 that detects a rising edge (leading edge) of an input waveform, a fall detection circuit 12 that detects a falling edge (trailing edge) of the input waveform, a determination circuit 13 that determines whether the pulse width of the input waveform is shorter than a given period based on detection results of the rise and fall detection circuits 11 and 12, and a pulse generation circuit 14 that generates a signal having a fixed pulse width. If a period between the rising edge of the input waveform and the falling edge thereof is shorter than a preset time period (e.g., 5 ns), the detection circuit 10 detects that the input waveform is abnormal. When the abnormal waveform is detected, the pulse generation circuit 14 generates a pulse signal having a fixed pulse width.

When the input waveform of signal A is abnormal, the pulse waveform detection circuit 10 operates as follows. When an abnormal waveform is input to the input terminal TI1 as the signal A, signals B, C, D and E as shown in FIG. 2 are output. It is a signal G that detects the rising edge of the abnormal waveform of the signal A, and the signal G rises in synchronization with the rising edge of the signal B. It is a signal F that detects the falling edge of the abnormal waveform of the signal A, and the signal F rises in synchronization with the falling edge of the signal C. The signals G and F are each set high for a given period from its rise.

Since the interval between the rise of the signal G and that of the signal F is shorter than the given period, a signal H generated from the signals G and F that have passed through the NAND circuit ND1 and the inverter IV9 or generated by ANDing both the signals G and F becomes high. In synchronization with the rising edge of the signal H, a signal I that is output from the pulse generation circuit 14 rises and remains at a high level for a fixed period of time. The circuit 10 can detect that the input waveform of the signal A is abnormal based on the fact that the level of the signal I becomes high.

When the input waveform of the signal A is normal, the pulse waveform detection circuit 10 operates as follows. When a normal waveform is input to the input terminal TI1 as the signal A, signals B, C, D and E as shown in FIG. 3 are output. It is a signal G that detects the rising edge of the normal waveform of the signal A, and the signal G rises in synchronization with the rising edge of the signal B. It is a signal F that detects the falling edge of the normal waveform of the signal A, and the signal F rises in synchronization with the falling edge of the signal C. The signals G and F are each set high for a given period from its rise, as described above.

The interval between the rise of the signal G and that of the signal F is longer than the given period, and a period for which the signal G remains at a high level and a period for which the signal F remains at a high level are separated from each other. Therefore, a signal H generated from the signals G and F that have passed through the NAND circuit ND1 and the inverter IV9 or generated by ANDing both the signals G and F does not become high, but a signal I that is output from the pulse generation circuit 14 remains low.

In accordance with the above operations, the pulse waveform detection circuit 10 can detect whether the input signal is abnormal or not (it includes noise), or whether the input signal has a pulse width that is shorter than a given period.

A semiconductor memory with the pulse waveform detection circuit shown in FIG. 1 will be described. In this semiconductor memory, the output signal of the pulse waveform detection circuit is supplied to the latch circuit, which is arranged in a stage precedent to the output buffer circuit, to prevent a signal due to an abnormal waveform from being transmitted.

Figure 4:
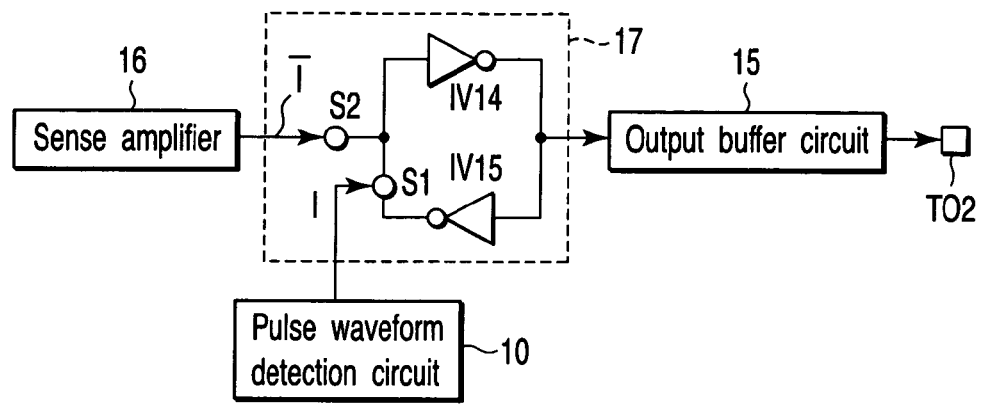
FIG. 4 is a block diagram of a semiconductor memory that includes the pulse waveform detection circuit according to the first embodiment of the present invention.

FIG. 4 is a block diagram of the semiconductor memory with the pulse waveform detection circuit. FIG. 4 shows no detailed arrangement of the pulse waveform detection circuit.

As shown in FIG. 4, a sense amplifier circuit 16 and a latch circuit 17 are arranged in a stage precedent to the output buffer circuit 15 of the semiconductor memory. The latch circuit 17 receives a latch signal I from the pulse waveform detection circuit 10. The latch signal I controls the latch timing of the latch circuit 17. The latch circuit 17 includes two inverters IV14 and IV15 and two switching circuits S1 and S2, as shown in FIG. 4. The switching circuits S1 and S2 are each configured by a transfer gate. The switching circuit S1 turns on when the level of the latch signal I is high and turns off when it is low. Conversely, the switching circuit S2 turns off when the level of the latch signal I is high and turns on when it is low. The latch circuit 17 is not limited to the arrangement shown in FIG. 4, but may have another arrangement.

The sense amplifier 16 amplifies a bit line potential read out of a memory cell and supplies it to the latch circuit 17. The latch circuit 17 latches or does not latch the signal output from the sense amplifier 16 using the latch signal I as a latch pulse and supplies it to the output buffer circuit 15.

When an abnormal waveform is input to an input buffer circuit (not shown), a signal due to the abnormal waveform is temporarily transmitted from the input buffer circuit to the latch circuit 17 through a decoder (not shown), a memory cell (not shown) and the sense amplifier 16. Since the abnormal waveform is also input as signal A to the pulse waveform detection circuit 10 and the latch signal I input to the latch circuit 17 becomes high, the latch circuit 17 latches the last stored signal. None of the signals due to the abnormal waveform are therefore transmitted to the output buffer circuit 15, and the semiconductor memory does not respond to the signals when viewed only from outside.

When a normal waveform is input to the input buffer circuit, the latch signal I input to the latch circuit 17 does not become high. The signal output from the sense amplifier 16 is thus supplied to the output buffer circuit 15 via the latch circuit 17 as is usual. Consequently, none of the signals transmitted to the output terminal TO2 via the latch circuit 17 and the output buffer circuit 15 are delayed.

As described above, the output signal of the pulse waveform detection circuit is supplied to the latch circuit arranged in a stage precedent to the output buffer circuit of the semiconductor memory. When an abnormal waveform is input, a signal due to the abnormal waveform can be prevented from being transmitted to the output buffer circuit. When a normal waveform is input, a signal is not delayed but can be transmitted as is usual and thus no access time is lengthened. It is thus possible to take measures only against an input abnormal waveform with no penalty for access time required when a normal waveform is input.

Second Embodiment

A read-only memory (ROM) with a page mode function, which includes a pulse waveform detection circuit according to a second embodiment of the present invention, will be described. In this ROM, the output signal of the pulse waveform detection circuit is supplied to a page mode decoder in a stage subsequent to an address buffer and a latch circuit in a stage precedent to an output buffer. An abnormal waveform and a signal due to the abnormal waveform can thus be prevented from being transmitted.

Figure 5:
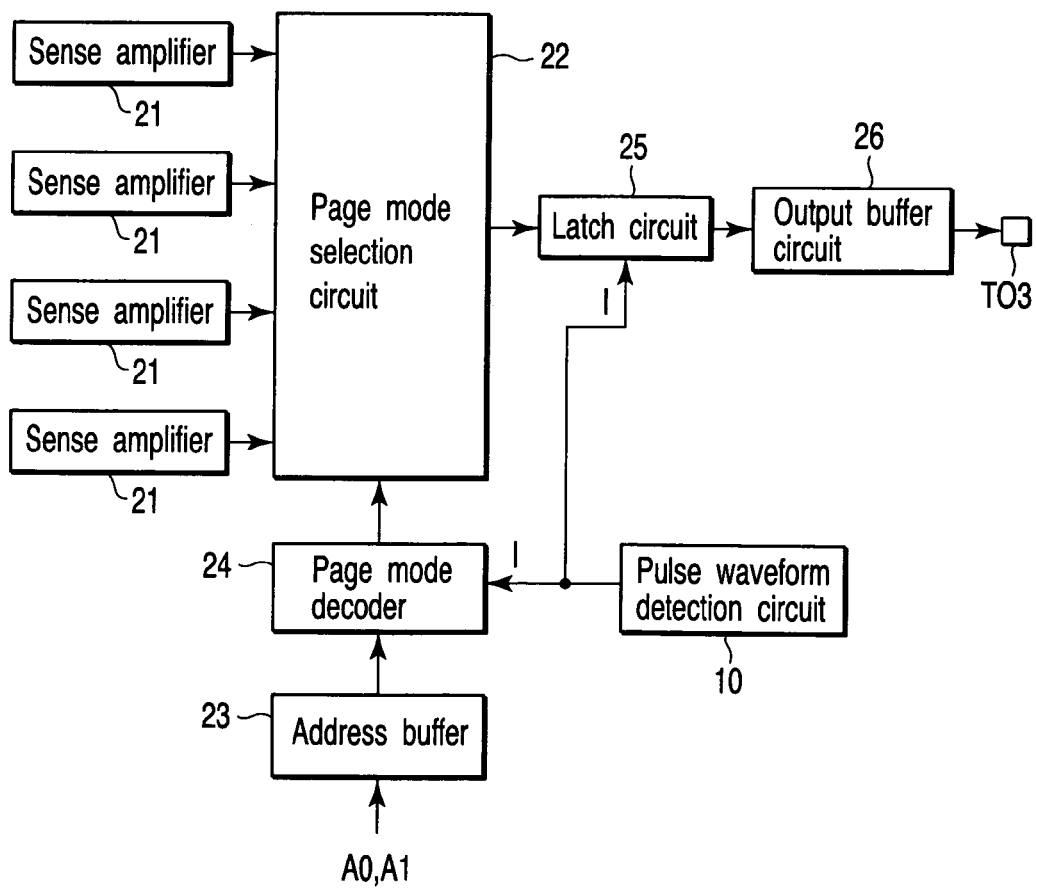
FIG. 5 is a block diagram of a read-only memory with a page mode function that includes a pulse waveform detection circuit according to a second embodiment of the present invention.

FIG. 5 is a block diagram of the read-only memory (ROM). FIG. 5 shows no detailed arrangement of the pulse waveform detection circuit.

The ROM includes a plurality of sense amplifiers 21, a page mode selection circuit 22, an address buffer 23, a page mode decoder 24, a latch circuit 25 and an output buffer circuit 26. The latch circuit 25 may have the same arrangement as that of the latch circuit 17 shown in FIG. 4 and may have another arrangement.

The number of sense amplifiers 21 is four or eight times as usual. These sense amplifiers 21 read data in parallel from memory cells. The read data is supplied to the page mode selection circuit 22, which is provided in a stage precedent to the output buffer circuit 26.

The page mode decoder 24 receives address signals A0 and A1 via the address buffer 23 and selects a page mode in response to the address signals A0 and A1. The page mode selection circuit 22 selects one of the data read out of the sense amplifiers 21 in accordance with the page mode selected by the page mode decoder 24 and supplies it to the latch circuit 25.

The latch circuit 25 receives a latch signal I from the pulse waveform detection circuit 10. The latch signal I controls the latch timing of the latch circuit 25. The latch circuit 25 latches or does not latch the data output from the page mode selection circuit 22 using the latch signal I as a latch pulse and supplies it to the output buffer circuit 26. In the above ROM, the page mode selection circuit 22 selects and outputs the data so read. Thus, a high-speed operation can be achieved.

A system whose access time is about 100 ns in normal mode requires access time of about 30 ns in page mode. If a noise filter of about 5 ns is provided at the input and output of the page mode selection circuit 22, the operating margin becomes very narrow. Conventionally, it has been thought that no anti-noise measures can be taken against such a system, but it is very effective to apply the present invention to the system.

When an abnormal waveform is input to the address buffer 23, a signal due to the abnormal waveform is temporarily transmitted from the address buffer 23 to the latch circuit 25 through the page mode decoder 24 and the page mode selection circuit 22. Since the abnormal waveform is also input to the pulse waveform detection circuit as the signal A and the latch signal I input to the latch circuit 25 becomes high. The latch circuit 25 latches the last stored signal. None of the signals due to the abnormal waveform are therefore transmitted to the output buffer circuit 26, and the semiconductor memory does not respond to the signals when viewed only from outside.

When a normal waveform is input to the address buffer 23, the latch signal I input to the latch circuit 25 does not become high. The signal output from the page mode selection circuit 22 is supplied to the output buffer circuit 26 via the latch circuit 25 as is usual. Consequently, none of the signals transmitted to the output terminal TO3 via the latch circuit 25 and the output buffer circuit 26 are delayed.

The page mode decoder 24 may include a latch circuit that latches the output signal of the page mode decoder 24 and supplies a signal I from the pulse waveform detection circuit 10 to the latch circuit as a latch pulse. This latch circuit may have the same arrangement as that of the latch circuit shown in FIG. 4 and may have an another arrangement.

When an abnormal waveform is input to the address buffer 23, a signal due to the abnormal waveform is temporarily transmitted from the address buffer 23 to the latch circuit in the page mode decoder 24. Since the latch signal I input to the latch circuit in the page mode decoder 24 becomes high, the latch circuit latches the last stored signal. None of the signals due to the abnormal waveform from the address buffer 23 are transmitted through the latch circuit or transmitted to the page mode selection circuit 22.

When a normal waveform is input to the address buffer 23, the latch signal I input to the latch circuit in the page mode decoder 24 does not become high. The signal output from the page mode decoder 24 in response to the address signals A0 and A1 output from the address buffer 23 is supplied to the page mode selection circuit 22 via the latch circuit as is usual. Consequently, none of the signals transmitted to the page mode selection circuit 22 via the page mode decoder 24 and the latch circuit are delayed.

As described above, the output signal of the pulse waveform detection circuit is supplied to the latch circuit in the stage precedent to the output buffer circuit and the latch circuit in the page mode decoder 24 in the stage subsequent to the address buffer. When an abnormal waveform is input, a signal due to the abnormal waveform can be prevented from being transmitted to the output buffer circuit. When a normal waveform is input, a signal can be transmitted without being delayed as is usual and thus no access time is delayed. It is thus possible to take measures only against an input abnormal waveform with no penalty for access time required when a normal waveform is input.

Third Embodiment

A semiconductor memory including a pulse waveform detection circuit according to a third embodiment of the present invention, such as a read-only memory (ROM), will be described. In this ROM, the output signal of the pulse waveform detection circuit is supplied to a latch circuit in a column decoder in a stage subsequent to the address buffer. A signal due to an abnormal waveform can thus be prevented from being transmitted.

Figure 6:
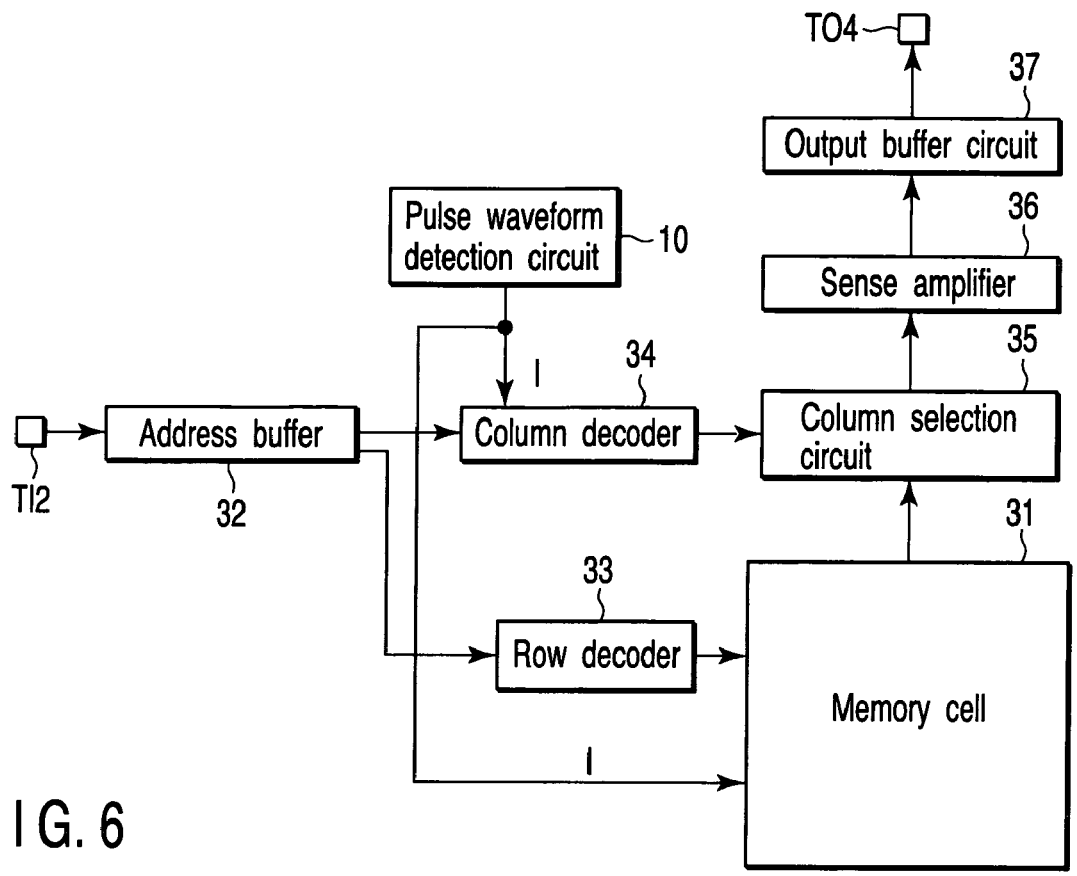
FIG. 6 is a block diagram of a read-only memory that includes a pulse waveform detection circuit according to a third embodiment of the present invention.

FIG. 6 is a block diagram of the read-only memory (ROM) including a pulse waveform detection circuit. FIG. 6 shows no detailed arrangement of the pulse waveform detection circuit.

The read-only memory includes a memory cell 31, an address buffer 32, a row decoder 33, a column decoder 34, a column selection circuit 35, a sense amplifier 36 and an output buffer circuit 37.

The address signal input to an input terminal TI2 is supplied to the row decoder 33 via the address buffer 32. The row decoder 33 selects and drives a word line connected to a memory cell in response to the address signal. The address signal is input to the column decoder 34 via the address buffer 32. The column decoder 34 has a latch circuit (a decoder hold circuit) that latches the output signal of the column decoder 34 and selects a bit line connected to a memory cell in response to the address signal. The latch circuit may have the same arrangement as that of the latch circuit 17 shown in FIG. 4 and may have another arrangement.

The column selection circuit 35 selects a connection between a bit line selected by the column decoder 34 and the sense amplifier 36. The sense amplifier 36 amplifies a bit line potential read out of a memory cell and supplies it to the output buffer circuit 37.

In a read-only memory, usually, the word line of a row decoder system increases in parasitic resistance and thus it is hard for the row decoder system to respond to an input signal having a short pulse width (abnormal waveform). On the other hand, a column decoder system has almost no parasitic resistance and possibly the column decoder system responds to the input signal having a pulse width of, e.g., about 5 ns, which sometimes causes a problem.

In the third embodiment, the column decoder 34 includes a latch circuit on its output side. The latch circuit latches the output signal of the column decoder 34. The latch circuit receives a signal I from the pulse waveform detection circuit 10 as a latch pulse.

When an abnormal waveform is input to the address buffer 32, a signal due to the abnormal waveform is temporarily transmitted from the address buffer 32 to the latch circuit in the column decoder 34. Since the latch signal I input to the latch circuit from the pulse waveform detection circuit 10 becomes high, the latch circuit latches the last stored signal. None of the signals due to the abnormal waveform from the address buffer 23 are therefore transmitted to the column selection circuit 35 through the latch circuit.

When a normal waveform is input to the address buffer 32, the latch signal I input to the latch circuit in the column decoder 34 does not become high. The signal output from the column decoder 34 in response to an address signal from the address buffer 32 is supplied to the column selection circuit 35 via the latch circuit as is usual. Consequently, none of the signals transmitted to the column selection circuit 35 via the column decoder 34 and the latch circuit 25 are delayed.

There is a case where a memory cell will respond to the input signal having a short pulse width (abnormal waveform) in a row decoder system as well as a column decoder system depending on the arrangement of memory cells. In this case, the row decoder 33 includes a latch circuit on its output side. The latch circuit latches the output signal of the row decoder 33. The latch circuit receives a signal I from the pulse waveform detection circuit 10 as a latch pulse. The latch circuit may have the same arrangement as that of the latch circuit 17 shown in FIG. 4 and may have an another arrangement.

When an abnormal waveform is input to the address buffer 32, a signal due to the abnormal waveform is temporarily transmitted from the address buffer 32 to the latch circuit in the row decoder 33. Since the latch signal I input to the latch circuit from the pulse waveform detection circuit 10 becomes high, the latch circuit latches the last stored signal. Therefore, none of the signals due to the abnormal waveform from the address buffer 23 are transmitted to the word line of the memory cell 31 through the latch circuit.

When a normal waveform is input the address buffer 32, the latch signal I input to the latch circuit in the row decoder 33 does not become high. The signal output from the row decoder 33 in response to an address signal from the address buffer 32 is supplied to the word line of the memory cell 31 via the latch circuit as is usual. Consequently, none of the signals transmitted to the memory cell 31 via the row decoder 31 and the latch circuit are delayed.

As described above, the output signal of the pulse waveform detection circuit is supplied to the latch circuit in the column decoder 34 or row decoder 33 in the stage subsequent to the address buffer in the ROM. When an abnormal waveform is input, a signal due to the abnormal waveform can be prevented from being transmitted to the column selection circuit 35 or the memory cell 31. When a normal waveform is input, a signal can be transmitted without being delayed as is usual and thus no access time is delayed. It is thus possible to take measures only against an input abnormal waveform with no penalty for access time required when a normal waveform is input.

Fourth Embodiment

A noise filter circuit having a pulse waveform detection circuit according to a fourth embodiment of the present invention will be described. In this noise filter circuit, the output signal of the pulse waveform detection circuit is used as an enable signal.

Figure 7:
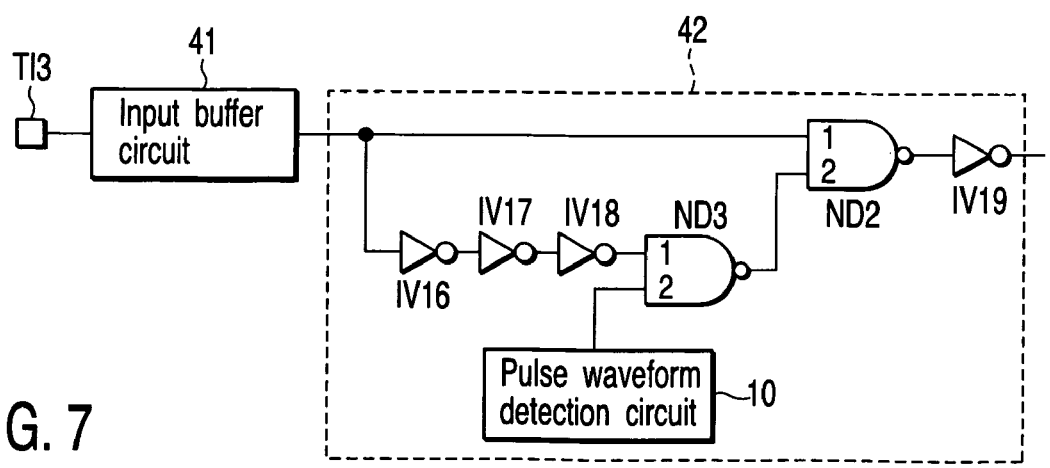
FIG. 7 is a block diagram of a noise filter circuit that includes a pulse waveform detection circuit according to a fourth embodiment of the present invention.

FIG. 7 is a block diagram of the noise filter circuit having a pulse waveform detection circuit. FIG. 7 shows no detailed arrangement of the pulse waveform detection circuit.

An input terminal TI3 is connected to the input terminal of an input buffer circuit 41. The output terminal of the input buffer circuit 41 is connected to the first input terminal of a NAND circuit ND2 in the noise filter circuit 42. The output terminal of the input buffer circuit 41 is also connected to the first input terminal of a NAND circuit ND3 via three inverters IV16, IV17 and IV18 connected in series.

The second input terminal of the NAND circuit ND3 is supplied with an enable signal I from the pulse waveform detection circuit 10. The enable signal I sets the noise filter 42 in an operating state (enabled state) or a nonoperating state. The output terminal of the NAND circuit ND3 is connected to the second input terminal of the NAND circuit ND2. The output terminal of the NAND circuit ND2 is connected to a circuit in the subsequent stage through an inverter IV19. The NAND circuits ND2 and ND3, inverters IV16 to IV19 and pulse waveform detection circuit 10 make up the noise filter circuit 42.

An operation of the noise filter circuit shown in FIG. 7 will be described.

The second input terminal of the NAND circuit ND3 in the noise filter circuit 42 is supplied with an enable signal I from the pulse waveform detection circuit 10. When an abnormal waveform is input to the input terminal TI3 and the pulse waveform detection circuit 10, the enable signal I output from the circuit 10 becomes high. When the enable signal I (high) is input to the second input terminal of the NAND circuit ND3, the noise filter circuit 42 operates to fulfill a filter function of eliminating the abnormal waveform from the input buffer circuit 41.

On the other hand, when a normal waveform is input to the input terminal TI3 and the pulse waveform detection circuit 10, the enable signal I output from the circuit 10 becomes low. When the enable signal I (low) is input to the second input terminal of the NAND circuit ND3, the noise filter circuit 42 does not operate to fulfill a filter function. The normal waveform output from the input buffer circuit 41 is not delayed but transmitted to a circuit in the subsequent stage.

As described above, the output signal of the pulse waveform detection circuit is used as an enable signal of the noise filter circuit. When an abnormal waveform is input, it can be prevented from being transmitted to a circuit in the subsequent stage. When a normal waveform is input, it is not delayed but can be transmitted as is usual. No access time is lengthened accordingly.

In the fourth embodiment, the noise filter circuit 42 is arranged in a stage subsequent to the input buffer circuit 41. The present invention is not limited to this arrangement. Even though the noise filter circuit 42 is arranged in a stage precedent to the input buffer circuit 41, the same advantages can be obtained. Furthermore, even though the noise filter circuit 42 is provided in the page mode decoder 24, column decoder 34 and row decoder 33 shown in FIGS. 5 and 6, the same advantages can be obtained.

According to the above embodiments, there can be provided a semiconductor device that is capable of eliminating an input noise without lengthening access time.

The foregoing embodiments can be executed not only alone but also in appropriate combination. Each of the embodiments contains inventions in various stages, and these inventions can be extracted from appropriate combinations of a plurality of components disclosed in the embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first detection circuit which detects a leading edge of a pulse waveform of an input signal;
    a second detection circuit which detects a trailing edge of the pulse waveform of the input signal;
    a determination circuit which determines whether a pulse width of the pulse waveform is shorter than a given period, based on detection results of the first detection circuit and the second detection circuit;
    a pulse generation circuit which generates a pulse signal when the determination circuit determines that the pulse width of the pulse waveform is shorter than the given period;
    a hold circuit which is set in one of a hold state and a conductive state in response to the pulse signal generated from the pulse generation circuit;
    a sense amplifier which reads a signal out of a memory cell and supplies the signal to the hold circuit; and
    an output buffer circuit which receives a signal from the hold circuit and supplies the signal to an outside.

2. The semiconductor device according to claim 1, wherein the hold circuit holds a last stored first signal output from the sense amplifier and interrupts a second signal output from the sense amplifier subsequent to the first signal when the pulse signal is a first voltage, and the hold circuit supplies the second signal to the output buffer circuit therethrough when the pulse signal is a second voltage.

3. A semiconductor device comprising:
    a first detection circuit which detects a leading edge of a pulse waveform of an input signal;
    a second detection circuit which detects a trailing edge of the pulse waveform of the input signal;
    a determination circuit which determines whether a pulse width of the pulse waveform is shorter than a given period, based on detection results of the first detection circuit and the second detection circuit;
    a pulse generation circuit which generates a pulse signal when the determination circuit determines that the pulse width of the pulse waveform is shorter than the given period;
    a hold circuit which is set in one of a hold state and a conductive state in response to the pulse signal generated from the pulse generation circuit;
    a plurality of sense amplifiers which read data out of memory cells at once;
    a page mode decoder which selects a page mode in response to an address signal;
    a selection circuit which selects one from the data read out of the sense amplifiers in the page mode selected by the page mode decoder and supplies the one to the hold circuit; and
    an output buffer circuit which receives the one from the hold circuit and supplies the one to an outside.

4. The semiconductor device according to claim 3, wherein
    the hold circuit holds a last stored first data output from the selection circuit and interrupts a second data output from the selection circuit subsequent to the first data when the pulse signal is a first voltage, and the hold circuit supplies the second data to the output buffer circuit therethrough when the pulse signal is a second voltage.

5. A semiconductor device comprising:
a first detection circuit which detects a leading edge of a pulse waveform of an input signal;
a second detection circuit which detects a trailing edge of the pulse waveform of the input signal;
a determination circuit which determines whether a pulse width of the pulse waveform is shorter than a given period, based on detection results of the first detection circuit and the second detection circuit;
a pulse generation circuit which generates a pulse signal when the determination circuit determines that the pulse width of the pulse waveform is shorter than the given period;
a column decoder including a decoder hold circuit which selects a bit line connected to a memory cell in response to an address signal and outputs a selection signal and which is set in one of a hold state and a conductive state in response to the pulse signal generated from the pulse generation circuit;
a sense amplifier which reads a signal out of the memory cell; and
a selection circuit which selects a connection between the bit line and the sense amplifier in response to the selection signal output from the decoder hold circuit.

6. The semiconductor device according to claim 5, wherein
the decoder hold circuit holds a last stored first selection signal output from the column decoder and interrupts a second selection signal output from the column decoder subsequent to the first selection signal when the pulse signal is a first voltage, and the decoder hold circuit supplies the second selection signal to the selection circuit therethrough when the pulse signal is a second voltage.

7. A semiconductor device comprising:
a first detection circuit which detects a leading edge of a pulse waveform of an input signal and outputs a first signal having a pulse width corresponding to a given period;
a second detection circuit which detects a trailing edge of the pulse waveform of the input signal and outputs a second signal having a pulse width corresponding to the given period;
a determination circuit which performs a logical operation in response to the first signal output from the first detection circuit and the second signal output from the second detection circuit and determines whether the pulse width of the pulse waveform is shorter than the given period;
a pulse generation circuit which generates a pulse signal when the determination circuit determines that the pulse width of the pulse waveform is shorter than the given period;
a hold circuit which is set in one of a hold state and a conductive state in response to the pulse signal generated from the pulse generation circuit;
a sense amplifier which reads a signal out of a memory cell and supplies the signal to the hold circuit; and
an output buffer circuit which receives the signal from the hold circuit and supplies the signal to an outside.

8. The semiconductor device according to claim 7, wherein
the hold circuit holds a last stored first signal output from the sense amplifier and interrupts a second signal output from the sense amplifier subsequent to the first signal when the pulse signal is a first voltage, and the hold circuit supplies the second signal to the output buffer circuit therethrough when the pulse signal is a second voltage.

9. A semiconductor device comprising:
a first detection circuit which detects a leading edge of a pulse waveform of an input signal and outputs a first signal having a pulse width corresponding to a given period;
a second detection circuit which detects a trailing edge of the pulse waveform of the input signal and outputs a second signal having a pulse width corresponding to the given period;
a determination circuit which performs a logical operation in response to the first signal output from the first detection circuit and the second signal output from the second detection circuit and determines whether the pulse width of the pulse waveform is shorter than the given period;
a pulse generation circuit which generates a pulse signal when the determination circuit determines that the pulse width of the pulse waveform is shorter than the given period;
a hold circuit which is set in one of a hold state and a conductive state in response to the pulse signal generated from the pulse generation circuit;
a plurality of sense amplifiers which read data out of memory cells at once;
a page mode decoder which selects a page mode in response to an address signal;
a selection circuit which selects one from the data read out of the sense amplifiers in the page mode selected by the page mode decoder and supplies the one to the hold circuit; and
an output buffer circuit which receives the once from the hold circuit and supplies the once to an outside.

10. The semiconductor device according to claim 9, wherein
the hold circuit holds a last stored first data output from the selection circuit and interrupts a second data output from the selection circuit subsequent to the first data when the pulse signal is a first voltage, and the hold circuit supplies the second data to the output buffer circuit therethrough when the pulse signal is a second voltage.

11. A semiconductor device comprising:
a first detection circuit which detects a leading edge of a pulse waveform of an input signal and outputs a first signal having a pulse width corresponding to a given period;
a second detection circuit which detects a trailing edge of the pulse waveform of the input signal and outputs a second signal having a pulse width corresponding to the given period;
a determination circuit which performs a logical operation in response to the first signal output from the first detection circuit and the second signal output from the second detection circuit and determines whether the pulse width of the pulse waveform is shorter than the given period;
a pulse generation circuit which generates a pulse signal when the determination circuit determines that the pulse width of the pulse waveform is shorter than the given period;
a column decoder including a decoder hold circuit which selects a bit line connected to a memory cell in response to an address signal and outputs a selection signal and which is set in one of a hold state and a conductive state in response to the pulse signal generated from the pulse generation circuit;

a sense amplifier which reads a signal out of the memory cell; and a selection circuit which selects a connection between the bit line and the sense amplifier in response to the selection signal output from the decoder hold circuit.

12. The semiconductor device according to claim 11, wherein the decoder hold circuit holds a last stored first selection signal output from the column decoder and interrupts a second selection signal output from the column decoder subsequent to the first selection signal when the pulse signal is a first voltage, and the decoder hold circuit supplies the second selection signal to the selection circuit therethrough when the pulse signal is a second voltage.

* * * * *